US008711329B2

(12) United States Patent
Van Kemenade

(10) Patent No.: US 8,711,329 B2
(45) Date of Patent: Apr. 29, 2014

(54) LITHOGRAPHIC APPARATUS AND DEVICE MANUFACTURING METHOD

(75) Inventor: Marc Van Kemenade, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 501 days.

(21) Appl. No.: 13/042,972

(22) Filed: Mar. 8, 2011

(65) Prior Publication Data

US 2012/0057142 A1    Mar. 8, 2012

Related U.S. Application Data

(60) Provisional application No. 61/329,251, filed on Apr. 29, 2010.

(51) Int. Cl.
  *G03B 27/42* (2006.01)
  *G03B 27/32* (2006.01)
  *G03F 7/20* (2006.01)
  *G03F 9/00* (2006.01)

(52) U.S. Cl.
  CPC ............ *G03F 7/705* (2013.01); *G03F 7/70633* (2013.01); *G03F 9/7003* (2013.01)
  USPC .............................................. 355/53; 355/77

(58) Field of Classification Search
  CPC ... G03F 7/705; G03F 9/7003; G03F 7/70633; G03F 7/70525; G03F 7/70783
  USPC ................. 356/399–401; 355/53, 77
  See application file for complete search history.

(56) References Cited

U.S. PATENT DOCUMENTS

| 6,842,230 | B2 | 1/2005 | Takakuwa et al. |
| 2002/0183989 | A1* | 12/2002 | Chien et al. ................... 703/2 |
| 2005/0219516 | A1* | 10/2005 | Smith ........................... 356/124 |
| 2007/0052940 | A1* | 3/2007 | Zaal et al. ...................... 355/53 |
| 2008/0073589 | A1 | 3/2008 | Adel et al. |
| 2011/0205511 | A1* | 8/2011 | Padiy et al. ..................... 355/53 |

FOREIGN PATENT DOCUMENTS

| JP | 2003-163156 A | 6/2003 |
| JP | 2005-303043 A | 10/2005 |
| JP | 2006-302935 A | 11/2006 |
| JP | 2009-231564 A | 10/2009 |

OTHER PUBLICATIONS

Pike et al., "High Order Wafer Alignment in Manufacturing", 2012, Proc. of SPIE vol. 8324, 832408-01.*
Wang et al., "Overlay Improvement by ASML HOWA 5th Alignment Strategy", 2009, Proc. of SPIE vol. 7520, 752023-1.*

* cited by examiner

*Primary Examiner* — Steven H Whitesell Gordon
(74) *Attorney, Agent, or Firm* — Sterne, Kessler, Goldstein & Fox P.L.L.C.

(57) ABSTRACT

A lithographic apparatus and method are used for manufacturing a device. A projection system is configured to project a patterned radiation beam onto a target portion of the substrate. A Higher Order Wafer Alignment (HOWA) model is applied so as to model higher order distortions across the substrate. The model is applied using at least one input parameter for which at least one intra-field effect has been taken into account. In an example, the intra-field effect taken into account is the ScanUp-ScanDown effect and/or the ScanLeft-ScanRight effect.

20 Claims, 2 Drawing Sheets

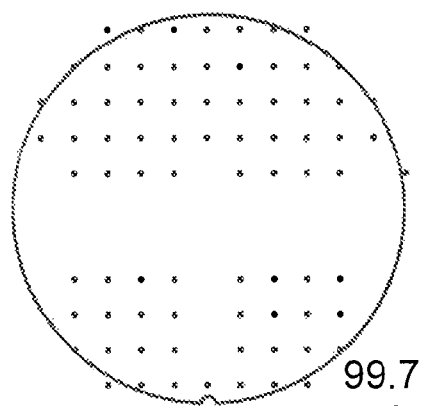
Fig. 2a  99.7%
x: 0.0nm
y: 0.1nm
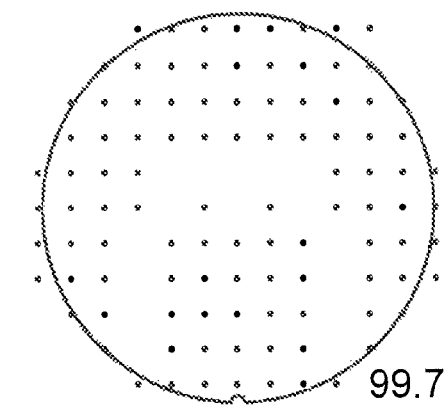
Fig. 2b  99.7%
x: 0.0nm
y: 0.2nm
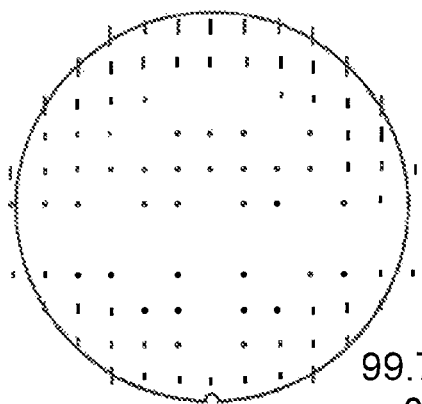
Fig. 2c  99.7%
x: 0.0nm
y: 0.9nm
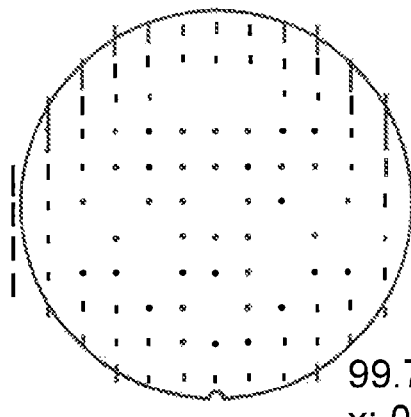
Fig. 2d  99.7%
x: 0.0nm
y: 1.5nm
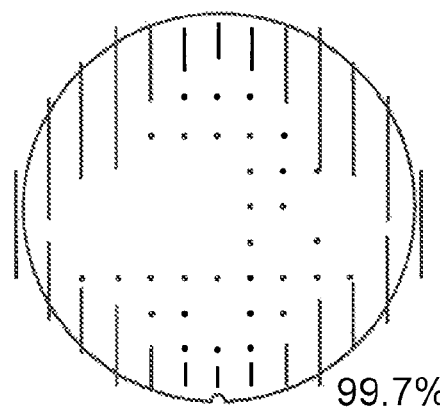
Fig. 2e  99.7%
x: 0.0nm
y: 5.8nm

LITHOGRAPHIC APPARATUS AND DEVICE MANUFACTURING METHOD

CROSS REFERENCE TO RELATED APPLICATIONS

This application claims benefit under 35 U.S.C. 119(e) to U.S. Provisional Application No. 61/329,251, filed Apr. 29, 2010, which is incorporated by reference herein in its entirety.

BACKGROUND

1. Field of the Invention

The present invention relates to a lithographic apparatus, and a method for manufacturing a device.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In device manufacturing methods using lithographic apparatus, overlay is an important factor in the yield, i.e., the percentage of correctly manufactured devices. Overlay is the accuracy within which layers are printed in relation to layers that have previously been formed. The overlay error budget will often be 10 nm or less, and to achieve such accuracy, the substrate must be aligned to the mask pattern to be transferred with great accuracy. Any distortions, deformations or any other alignment errors can have a negative impact on overlay.

Errors of the type which may affect overlay tend to fall into two categories, intra field errors which are errors that occur within a single exposure field, and inter-field (or wafer grid) errors which are errors that occur when the tool steps from one field to the next.

In order to compensate for wafer deformation introduced by e.g., wafer processing (a thermal process can introduce stress in a wafer, which causes it to deform), it is sometimes desirable to perform Higher Order Wafer Alignment (HOWA) modeling. By measuring at multiple locations on the wafer, a HOWA model can be fitted, which follows the deformation. This fit determines what is called the wafer grid. Wafer grids determine the locations where many lithographic systems expose fields. As the type of wafer deformation mentioned above is an inter-field effect, HOWA models are applied to compensate for such inter-field effects. However, intra-field effects tend to distort inter-field wafer grids produced by the current polynomial based HOWA models.

This issue is exacerbated at the wafer edge. For example a 5th order polynomial HOWA model has 42 degrees of freedom; compared to just 6 for a commonly used linear 6 parameter model. At the wafer edge in particular; the density of measurements obtained for the model is less than for the center of the wafer, and the modeling accuracy at the wafer edge suffers accordingly. This issue, in combination with errors due to intra-field effects can result in overlay errors at the wafer edge of 5 nm or more.

SUMMARY

It is desirable to take into account intra-field effects such as, but not limited to, the 'ScanUp-ScanDown (SUSD) effect' when using a Higher Order Wafer Alignment model, without encountering the drawbacks of the abovementioned typical devices.

According to an aspect of the invention, there is provided a lithographic apparatus having an illumination system configured to condition a radiation beam. A support is constructed to support a patterning device capable of imparting the radiation beam with a pattern in its cross-section to form a patterned radiation beam. A substrate table is constructed and arranged to hold a substrate. A projection system is configured and arranged to project the patterned radiation beam onto a target portion of the substrate. The apparatus is further configured to apply a nth order substrate alignment model so as to model nth order distortions across the substrate, where n is an integer greater than 1. The model is applied using at least one input parameter for which at least one intra-field effect has been taken into account.

According to a further aspect of the invention, there is provided a device manufacturing method comprising: projecting a patterned beam of radiation onto a target portion of a substrate. An nth order substrate alignment model is applied so as to model nth order distortions across the substrate, where n is an integer greater than 1. The model is applied using at least one input parameter for which at least one intra-field effect has been taken into account.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 2a illustrates the problem of the 'ScanUp-ScanDown (SUSD) effect' and its effect on overlay using a commonly used 6 parameter substrate alignment model.

Figure 1:
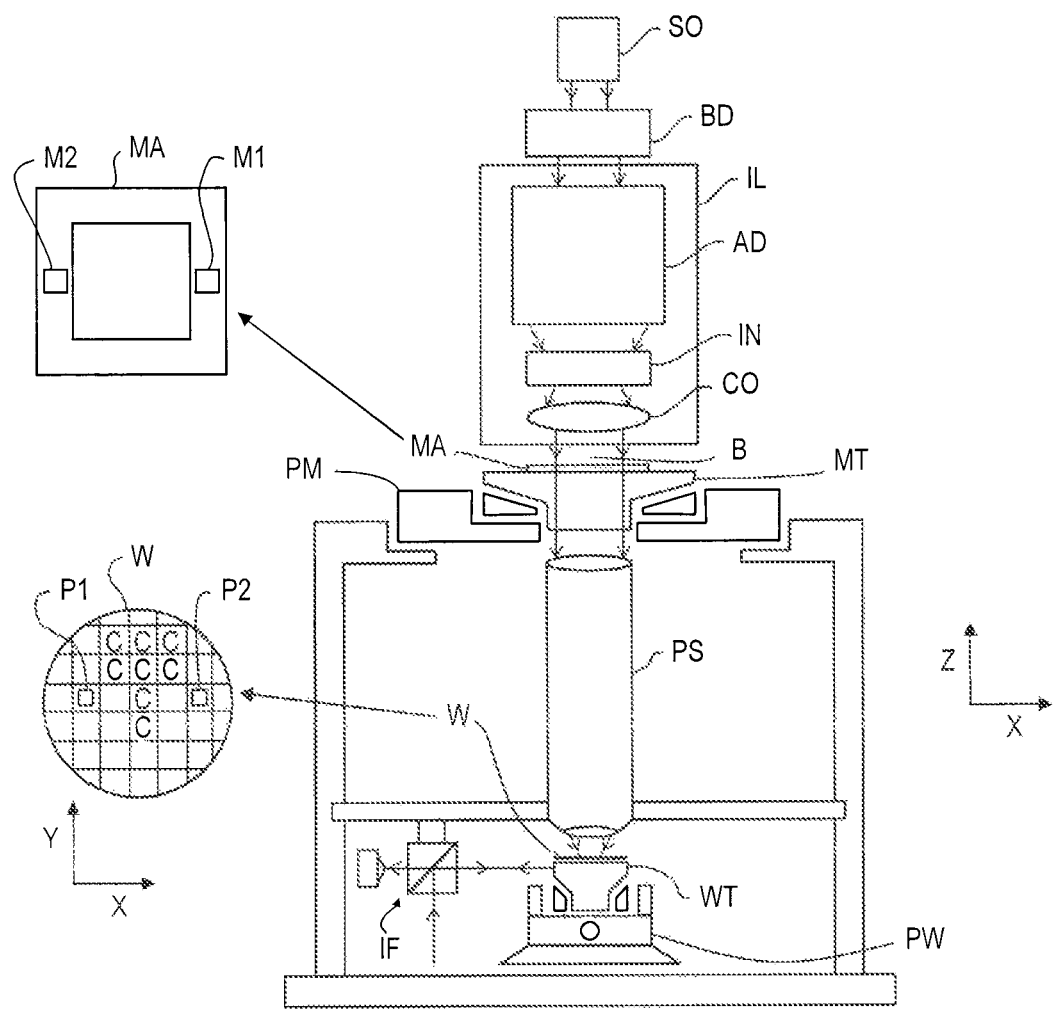
FIG. 1 is a schematic diagram of a lithographic apparatus according to an embodiment of the invention.

FIGS. 2b, 2c, 2d, and 2e illustrate the problem of the 'ScanUp-ScanDown (SUSD) effect' and its effect on overlay using Higher Order Wafer Alignment models of polynomial orders 2 to 5 respectively.

The features and advantages of the present invention will become more apparent nom the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the invention. The apparatus includes an illumination system (illuminator) IL configured to condition a radiation beam B (e.g., UV radiation or EUV radiation). A support structure (e.g., a mask table) MT is constructed and arranged to support a patterning device (e.g., a mask) MA. A first positioner PM is configured to accurately position the patterning device in accordance with certain parameters. A substrate table (e.g., a wafer table) WT is constructed and arranged to hold a substrate (e.g., a resist coated wafer) W. A second positioner PW is configured and arranged to accurately position the substrate in accordance with certain parameters. A projection system (e.g., a refractive projection lens system) PS is configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. The pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

FIG. 1 is a schematic diagram of a lithographic apparatus according to an embodiment of the invention. The illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source ray be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least a scan mode, whereupon the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Furthermore, one issue with scanners is that usually half of the target portions is scanned in a certain direction, while the other half of the target portions is scanned in a direction opposite to this direction, so as to decrease the overall scanning time and increase throughput. However, this results in an effect known as the 'ScanUp-ScanDown (SUSD) effect' whereby some parameters of the target portions (fields) that are scanned up, such as translation, may be measurably different to those of the fields that are scanned down. A parameter such as translation can be treated as either an intra-field or an inter-filed parameter. If it is treated as an intra-field parameter, all fields are translated. If translation is treated as an inter-field parameter, the wafer grid is translated. The SUSD effect may be thought of as an intra-field effect, which presents a difficulty when a Higher Order Wafer Alignment model is to be applied to compensate for wafer deformation, for the reasons explained above. Therefore, the SUSD effect is a specific example of the issue identified in the previous paragraph. It is noted that a similar effect called 'StepLeft-StepRight (SLSR) effect' can have the same impact on HOWA modeling An attempt to address this issue has been disclosed in U.S. Pub. No. 2008/0073589, which is incorporated by reference herein in its entirety. This describes the use of feedback, which involves physically measuring the effect of the differences between up and down scan exposures on the exposed pattern and storing this measured effect such that it may be taken into account when modeling subsequent exposures. However, such methods require a lot more context information as regards to the values of other parameters and settings, which makes the method far too complex; or if this context information is not provided, not sufficiently accurate to be useful.

The following description focuses on the specific examples of the ScanUp-ScanDown (SUSD) and StepLeft-StepRight (SLSR) effects and Low High Order Wafer Alignment (HOWA) modeling can be adapted to compensate or correct for the consequences of these intra-field effects. The skilled person will appreciate that these are specific examples only and that the invention is equally applicable to other intra-field effects, such as those resultant from lens heating, for example.

As explained previously, it is sometimes desirable to perform High Order Wafer Alignment (HOWA) modeling to follow, and therefore compensate for, wafer deformation. One important parameter of a wafer alignment model, whether it be a HOWA model or not, is translation (relative displacement in a particular direction, for example the model parameters may include x-translation and y-translation). The translation can be treated as either an intra-field parameter or inter-field parameter. As mentioned before, if translation is treated as an intra-field parameter, all fields are translated, while the wafer grid is translated if translation is treated as an inter-field parameter.

During lithographic exposure of the type concerned herein, each field on a wafer is exposed in a scan (hence the commonly used name 'scanner'). This scan is usually performed by a movement in Y direction of a stage/chuck on which a wafer is placed. To improve scanner productivity/throughput, scanning is often done in opposite directions for subsequent strokes of fields (sequence: +Y, −Y, +Y, −Y, etc.), consequently half of the fields are scanned in +Y direction and the other half in −Y direction.

It has been found that some parameters of fields exposed in +Y are slightly different than those of fields exposed in −Y, such as the translation parameter. This phenomenon is called the 'ScanUp-ScanDown (SUSD) effect'. Typically the SUSD effect can result in translation differences between up and down scanned fields of up to 1 nm.

There is a similar effect to SUSD called 'StepLeft-StepRight' (SLSR) effect, which can have a similar impact on certain field parameters, and for which the following methods can also be used to address the effects thereof. In fact, with context information (such as whether a field was scanned left or right in a certain exposure) and knowledge about intrafield effects resultant from SLSR, the affected parameters can be modeled separately and removed like in the SUSD example explained here.

As HOWA modeling is meant to deal with wafer processing effects, which are global effects (inter-field), local scanner effects (intra-field), such as the SUSD effect, distort HOWA grids causing overlay errors. Consequently, knowledge about whether a field was scanned up or down in a previous exposure is not considered when a HOWA model is calculated.

When using a HOWA model instead of a commonly used 6 parameter model to determine a wafer grid, the number of degrees of freedom is increased. The higher the order of HOWA model used, the more degrees of freedom are involved in the model. Whereas the commonly used linear 6 parameter model has 6 degrees of freedom, a 3rd order polynomial HOWA model has 20 degrees of freedom and a 5th order polynomial HOWA model has 42 degrees of freedom. Therefore, when using a HOWA model in preference to a linear 6 parameter model, there is a large increase in the number of degrees of freedom that have to be determined accurately for the wafer grid to be accurate. As the density of measurements at the wafer edge is usually less compared with the center of the wafer, problems with accuracy of the wafer grid occur, particularly at these wafer edges, and consequently any distortion is particularly pronounced at the wafer edges.

FIG. 2 illustrates the effect of this distortion by showing the overlay impact resultant from a SUSD relative translation of 1 nm, for different orders of wafer alignment model. FIG. 2a shows this effect for the standard linear 6 parameter model, while FIGS. 2b-2e show this effect for higher order polynomial wafer alignment models of orders 2 through to 5 respectively. It can be seen that for a 5th order HOWA model, the overlay impact is as much as 5.8 nm for a typical 1 nm SUSD displacement. These figures also illustrate how this overlay impact is larger at the wafer edge, as a consequence of the reasons explained in the previous paragraph.

Therefore it is beneficial for wafer alignment methods to use additional information e.g., exposure routing of the previous layer (and possibly the current layer). The exposure routing of the previous layer is most critical, since that layer contains the SUSD effect that can be measured by alignment. The exposure routing of the current layer is less important, because the SUSD effect of this exposure can be taken care of by the advanced process control (APC) system.

Feedback solutions have previously been attempted. Such solutions considered the exposure routing, but they were overly complex. Instead the present invention uses a feedforward solution, for which the exposure routing is taken into account when HOWA modeling is performed. This is achieved by considering the effect of SUSD on the translation parameters, and in particular the y-translation parameter (i.e., the parameter of translation in the scanning direction), or equally by considering the effect of SLSR on the translation parameters, and in particular the x-translation parameter (i.e., the parameter of translation in the stepping direction), instead of simply measuring the actual SUSD/SLSR effect on the translation parameters after performing the actual scan and feeding this back.

With regard to SUSD in particular, two methods are proposed. Doing either will significantly lessen the impact resultant from the SUSD effect on the wafer grid, especially at the lesser dense sampled wafer edge. From these methods, it should be clear to the skilled person that equivalent methods exist for the SLSR effect, and how such methods would be implemented.

A previous method is to split, within the HOWA model, the input translation parameters (translation x and translation y) per wafer into translation Tx_up (the x-translation parameter for the "up-scanned" fields), translation Tx_down (the x-translation parameter for the "down-scanned" fields), translation Ty_up (the y-translation parameter for the "up-scanned" fields) and translation Ty_down (the y-translation parameter for the "down-scanned" fields). However, should the effect of SUSD only have a y-direction impact (which is often the case), then the usual single parameter for x should be sufficient. This method is particularly applicable when exposure routing is different from the previous layer or the SUSD effect is different on the current layer exposure tool than on the previous layer exposure tool. Using this method, the advanced process control (APC) system can take care of the intra-field delta. This is a simple correction, because the alignment system takes care of the previous layer (it is measured, modeled and will be corrected) and the APC system only needs the information from the current layer exposure to correct for the current layer intra-field error. Consequently, the APC does not need the previous layer context, which is a further improvement on the aforementioned typical devices.

Alternatively, when it is known that the exact same intra-field effects that are present in the previous layer will occur in the current layer, a translation difference between up and down scanned fields can be calculated and the translation input parameter can be corrected for this translation difference. This corrected translation parameter can then be used for the y-translation parameter in the normal way when applying the current HOWA model. In a particular embodiment, the y-translation parameter used may be calculated as (Ty_UP+Ty_DOWN)/2, where Ty_UP is the y-translation parameter for the "up-scanned" fields and Ty_DOWN is the y-translation parameter for the "down-scanned" fields, if the same intra-field error is made twice, the intra-field overlay delta is cancelled out. Similar techniques can be performed for the x-translation parameter should it be affected by the SUSD effect. It should be noted that Ty_UP and Ty_DOWN still should be modeled to avoid the large edge effects in the inter-field model in case the intra-field effect is SUSD.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory; magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation. Without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate; and
    a processor configured to apply an nth order wafer alignment model that compensates for substrate deformations, where n is an integer greater than 1, the nth order alignment model being configured to reduce an impact of at least one intra-field effect on the nth order wafer alignment model.

2. The lithographic apparatus of claim 1, wherein the impact of the at least one intra-field effect on the nth order wafer alignment model has not been predetermined by measurement.

3. The lithographic apparatus of claim 1, wherein the nth order alignment model uses at least one translation parameter.

4. The lithographic apparatus of claim 3, wherein the at least one translation parameter for the nth order wafer alignment model comprises a first translation parameter for the target portions scanned in a first direction in a first dimension, and a second translation parameter for target portions scanned in a second, opposite, direction in the first dimension.

5. The lithographic apparatus of claim 4, wherein the first dimension is the y-dimension.

6. The lithographic apparatus of claim 4, wherein that the at least one input parameter for the nth order wafer alignment model further comprises two separate translation parameters corresponding to a second dimension.

7. The lithographic apparatus of claim 1, wherein:
    the patterned radiation beam is scanned across the target portion of the substrate, the scanning direction being different for different target portions, and
    the at least one intra-field effect is resultant from the scanning direction being different for different target portions.

8. The lithographic apparatus of claim 7, wherein approximately half of the target portions are scanned in a first direction and the remainder of the target portions are scanned in a second, opposite, direction.

9. The lithographic apparatus of claim 7, wherein when a translation error is known to be the same for subsequent layers to be exposed on the substrate, a translation difference between the target portions scanned in a first direction and the target portions scanned in a second, opposite, direction is calculated and at least one input parameter of the nth order wafer alignment model is corrected for this translation difference.

10. The lithographic apparatus of claim 9, wherein the at least one corrected input parameter is determined by determining the average of the first translation parameter for the target portions scanned in a first direction and the second translation parameter for target portions scanned in a second direction.

11. A device manufacturing method comprising:
projecting a patterned beam of radiation onto a target portion of a substrate; and
applying an nth order wafer alignment model that compensate for substrate deformations, where n is an integer greater than 1, the nth order wafer alignment model being configured to reduce an impact of at least one intra-field effect on the nth order wafer alignment model.

12. The device manufacturing method of claim 11, wherein the impact of the at least one intra-field effect on the nth order wafer alignment model has not been predetermined by measurement.

13. The device manufacturing method of claim 11, wherein the nth order alignment model uses at least one translation parameter.

14. The device manufacturing method of claim 13, wherein the at least one translation parameter for the nth order wafer alignment model comprises a first translation parameter for the target portions scanned in a first direction in a first dimension, and a second translation parameter for target portions scanned in a second, opposite, direction in the first dimension.

15. The device manufacturing method of claim 14, wherein the first dimension is the y-dimension.

16. The device manufacturing method of claim 14, wherein the at least one input parameter for the nth order wafer alignment model further comprises two separate translation parameters corresponding to a second dimension.

17. The device manufacturing method of claim 11, wherein:
the patterned radiation beam is scanned across the target portion of the substrate during the projecting, the scanning direction being different for different target portions; and
the at least one intra-field effect is resultant from the scanning direction being different for different target portions.

18. The device manufacturing method of claim 17, wherein approximately half of the target portions are scanned in a first direction and the remainder of the target portions are scanned in a second, opposite, direction.

19. The device manufacturing method of claim 17, wherein, where a translation error is known to be the same for subsequent scanning layers, a translation difference between the target portions scanned in a first direction and the target portions scanned in a second direction is calculated and at least one input parameter of the nth order wafer alignment model is corrected for this translation difference.

20. The device manufacturing method of claim 19, wherein the at least one corrected input parameter is determined by determining the average of the first translation parameter for the target portions scanned in a first direction and the second translation parameter for target portions scanned in a second, opposite, direction.

* * * * *